United States Patent
Tang et al.

(10) Patent No.: US 9,508,924 B2
(45) Date of Patent: Nov. 29, 2016

(54) METHOD AND SYSTEM FOR PROVIDING RARE EARTH MAGNETIC JUNCTIONS USABLE IN SPIN TRANSFER TORQUE MAGNETIC RANDOM ACCESS MEMORY APPLICATIONS

(71) Applicant: Samsung Electronics Co., LTD., Gyeonggi-do (KR)

(72) Inventors: Xueti Tang, Fremont, CA (US); Jangeun Lee, Cupertino, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/731,267

(22) Filed: Jun. 4, 2015

(65) Prior Publication Data

US 2016/0005956 A1 Jan. 7, 2016

Related U.S. Application Data

(60) Provisional application No. 62/020,941, filed on Jul. 3, 2014.

(51) Int. Cl.
| | |
|---|---|
| *H01L 43/00* | (2006.01) |
| *G11C 11/16* | (2006.01) |
| *H01L 43/10* | (2006.01) |
| *H01L 43/12* | (2006.01) |
| *H01L 43/08* | (2006.01) |

(52) U.S. Cl.
CPC .............. *H01L 43/10* (2013.01); *H01L 43/08* (2013.01); *H01L 43/12* (2013.01)

(58) Field of Classification Search
CPC ....... H01L 43/08; H01L 43/10; H01L 42/12; H01L 27/222; H01L 27/22; G11C 11/14–11/16; G11C 11/161
See application file for complete search history.

(56) References Cited

U.S. PATENT DOCUMENTS

| | | | |
|---|---|---|---|
| 7,378,716 B2 | 5/2008 | Kim | |
| 7,531,830 B2 | 5/2009 | Kaiser | |
| 7,714,399 B2 | 5/2010 | Morise | |
| 7,973,349 B2 | 7/2011 | Huai | |
| 8,411,498 B2 * | 4/2013 | Kim | ...................... B82Y 25/00 365/148 |

(Continued)

OTHER PUBLICATIONS

Spin transfer switching in TbCoFe/CoFeB/MgO/CoFeB/TbCoFe magnetic tunnel junctions with perpendicular magnetic anisotropy, M. Nakayama; T. Kai; N. Shimormura; M. Amano; E. Kitagawa; T. Nagase; M. Yoshikawa; T. Kishi; S. Ikegawa; H. Yoda, Journal of Applied Physics, vol. 103, No. 7, 07A710 pp. 1-3, Publication Date: Apr. 2008.

(Continued)

*Primary Examiner* — Allison P Bernstein

(74) *Attorney, Agent, or Firm* — Convergent Law Group LLP

(57) ABSTRACT

A magnetic junction usable in a magnetic device and a method for providing the magnetic junction are described. The magnetic junction includes a free layer, a pinned layer and nonmagnetic spacer layer between the free and pinned layers. The free layer is switchable between stable magnetic states when a write current is passed through the magnetic junction. The free and pinned layers each has a layer perpendicular magnetic anisotropy energy greater than an out-of-plane demagnetization energy. At least one of the pinned layer and the free layer includes a multilayer. The multilayer includes at least one bilayer. Each of the bilayer (s) has a first layer and a second layer. The first layer includes an alloy of a magnetic transition metal and a rare earth. The second layer includes an amorphous magnetic layer. The multilayer has a nonzero perpendicular magnetic anisotropy up to at least four hundred degrees Celsius.

18 Claims, 7 Drawing Sheets

(56) References Cited

U.S. PATENT DOCUMENTS

| | | | |
|---|---|---|---|
| 8,445,979 B2* | 5/2013 | Oh | B82Y 25/00 257/421 |
| 8,514,617 B2 | 8/2013 | Yamada | |
| 2013/0001717 A1* | 1/2013 | Zhou | H01F 10/3286 257/421 |
| 2013/0069182 A1 | 3/2013 | Ohsawa | |
| 2013/0078482 A1 | 3/2013 | Shukh | |
| 2013/0270523 A1 | 10/2013 | Wang | |
| 2014/0016405 A1 | 1/2014 | Dieny | |

OTHER PUBLICATIONS

The Effects of Electrode and Annealing on CoFeB—MgO—TbFeCo Perpendicular Magnetic Tunnel Junctions L. Ye; C. Lee; J. Lee; W. Tseng; T. Wu, Magnetics, IEEE Trans. on, vol. 48, No. 11, pp. 2820-2822, Publication Date: Nov. 2012.

Magnetic properties of TbFeCo-based perpendicular magnetic tunnel junctions; C. Lee; L. Ye; T. Hsieh; C. Huang; T. Wu, Journal of Applied Physics, vol. 107, pp. 09C712, Publication Date: May 5, 2010.

A structural, magnetic, and Mossbauer spectral study of the $TbCo_4{-}xFe_xB$ compounds with x=0, 1, and 2 H. Mayot;, O. Isnard; F. Grandjean; G. J. Long,, Journal of Applied Physics, vol. 105, pp. 113908, Publication Date: Jun. 2, 2009.

Light-induced magnetization reversal of high-anisotropy TbCo alloy films, S. Alebrand; M. Gottwald; M. Hehn; D. Steil; M. Cinchetti; D. Lacour; E. E. Fullerton; M. Aeschlimann; S. Mangin, Applied Physics Letters, vol. 101, No. 162408, pp. 1-15, Publication Date: Oct. 19, 2012.

Soft magnetic properties of Co—Fe—Al—N films H. Iwasaki; R. Akashi; Y. Ohsawa, Journal of Applied Physics, vol. 73, pp. 8441, Publication Date: Feb. 15, 1993.

\* cited by examiner

METHOD AND SYSTEM FOR PROVIDING RARE EARTH MAGNETIC JUNCTIONS USABLE IN SPIN TRANSFER TORQUE MAGNETIC RANDOM ACCESS MEMORY APPLICATIONS

CROSS-REFERENCE TO RELATED APPLICATIONS

This application claims the benefit of provisional Patent Application Ser. No. 62/020,941, filed Jul. 3, 2014, entitled TB-BASED MUTILAYERS FOR STT=RAM, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional dual magnetic tunneling junction (MTJ) 10 as it may be used in a conventional STT-MRAM. The conventional MTJ 10 typically resides on a substrate 12. A bottom contact 14 and top contact 24 may be used to drive current through the conventional dual MTJ 10 in a current-perpendicular-to-plane (CPP) direction, or along the z-axis as shown in FIG. 1. The conventional MTJ, uses conventional seed layer(s) (not shown), may include capping layers (not shown) and may include a conventional antiferromagnetic (AFM) layer (not shown). The conventional magnetic junction 10 includes a conventional bottom pinned layer 16, a conventional tunneling barrier layer 18, a conventional free layer 20, a conventional second tunneling barrier layer 22 and a conventional top pinned layer 30.

The conventional pinned layers 16 and 30 and the conventional free layer 20 and the conventional pinned structure 10 are magnetic. The magnetizations 17 and 31 of the conventional pinned layers 16 and 30, respectively, are fixed, or pinned, in a particular direction. Although depicted as a simple (single) layer, the conventional pinned layer 16 and/or 30 may include multiple layers. For example, the conventional pinned layer 16 and/or 30 may be a synthetic antiferromagnetic (SAF) structure including magnetic layers antiferromagnetically coupled through thin conductive layers, such as Ru. The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru.

To switch the magnetization 21 of the conventional free layer 20, a current is driven perpendicular to plane (in the z-direction). When a sufficient current is driven from the top contact 22 to the bottom contact 14, the magnetization 21 of the conventional free layer 20 may switch to be parallel to the magnetization 17 of the conventional pinned layer 16. When a sufficient current is driven from the bottom contact 11 to the top contact 22, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. Mechanisms for improving the performance of STT-RAM are desired. For example, a high perpendicular magnetic anisotropy and a high magnetoresistance are desired. Accordingly, what is needed is a method and system that may improve the performance of the spin transfer torque based memories. The method and system described herein address such a need.

BRIEF SUMMARY OF THE INVENTION

A magnetic junction usable in a magnetic device and a method for providing the magnetic junction are described. The magnetic junction includes a free layer, a pinned layer and nonmagnetic spacer layer between the free and pinned layers. The free layer is switchable between stable magnetic states when a write current is passed through the magnetic junction. The free layer and pinned layer each has a layer perpendicular magnetic anisotropy energy greater than an out-of-plane demagnetization energy. At least one of the pinned layer and the free layer includes a multilayer. The multilayer includes at least one bilayer. Each of the bilayer(s) has a first layer and a second layer. The first layer includes an alloy of a magnetic transition metal and a rare earth. The second layer includes an amorphous magnetic layer. The multilayer has a nonzero perpendicular magnetic anisotropy up to at least four hundred degrees Celsius.

DETAILED DESCRIPTION OF THE INVENTION

Figure 1:
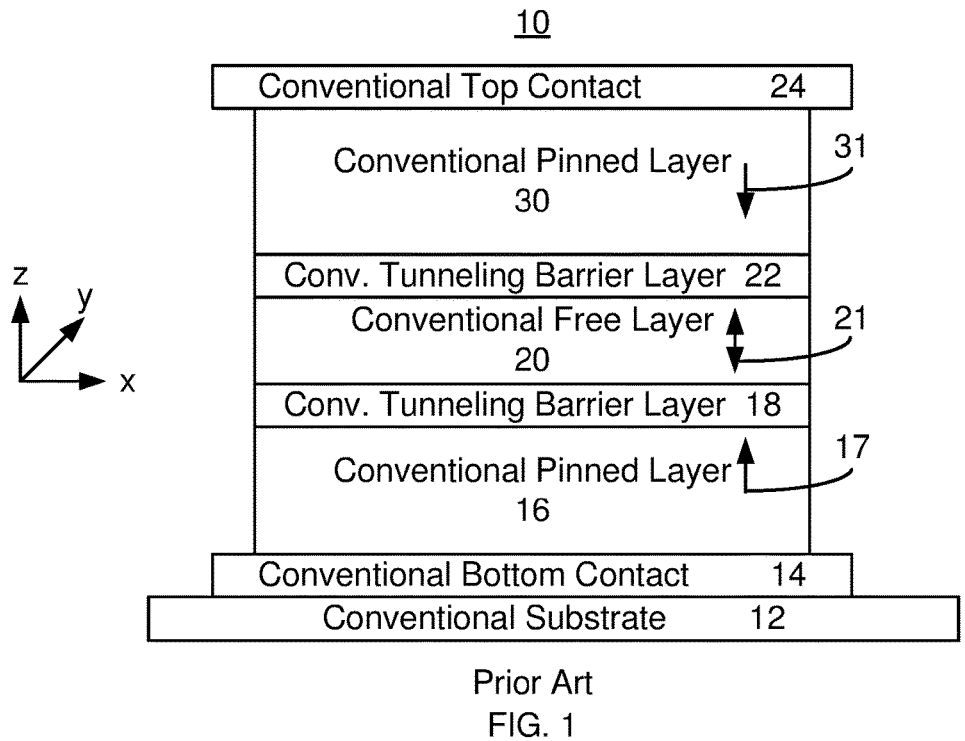
FIG. 1 depicts a conventional dual magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and nonportable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction usable in a magnetic device and a method for providing the magnetic junction are described. The magnetic junction includes a free layer, a pinned layer and nonmagnetic spacer layer between the free and pinned layers. The free layer is switchable between stable magnetic states when a write current is passed through the magnetic junction. The free layer and pinned layer each has a layer perpendicular magnetic anisotropy energy greater than an out-of-plane demagnetization energy. At least one of the pinned layer and the free layer includes a multilayer. The multilayer includes at least one bilayer. Each of the bilayer(s) has a first layer and a second layer. The first layer includes an alloy of a magnetic transition metal and a rare earth. The second layer includes an amorphous magnetic layer. The multilayer has a nonzero perpendicular magnetic anisotropy up to at least four hundred degrees Celsius.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
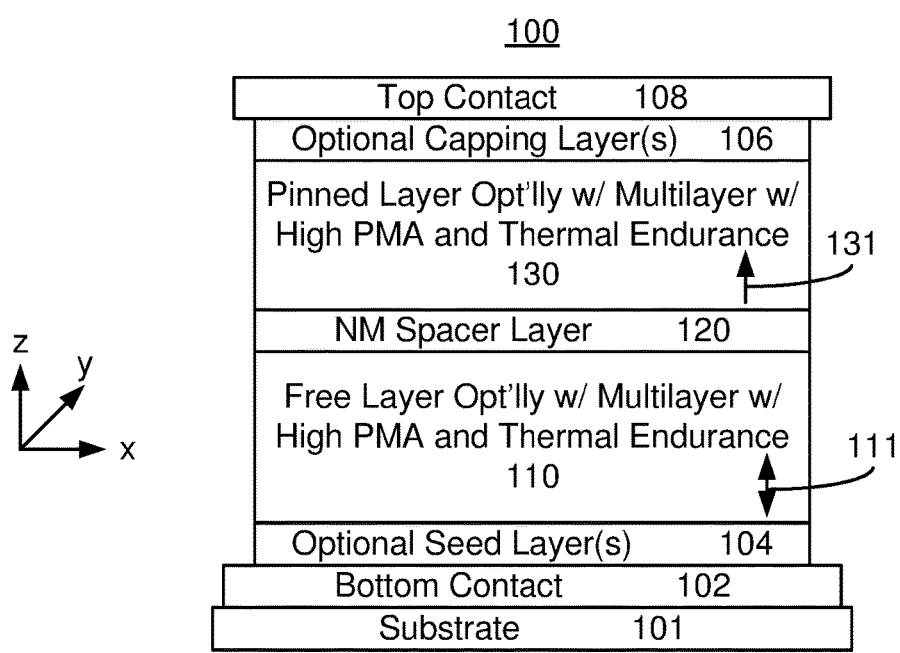
FIG. 2 depicts an exemplary embodiment of a magnetic junction including a high perpendicular magnetic anisotropy and thermally robust multilayer usable in a magnetic memory programmable using spin transfer torque.

FIG. 2 depicts an exemplary embodiment of a magnetic junction 100 including at least one high perpendicular magnetic anisotropy and thermally robust multilayer. The magnetic junction 100 is usable in a magnetic memory programmable using spin transfer torque. For clarity, FIG. 2 is not to scale. The magnetic junction 100 may be used in a magnetic device such as a STT-RAM and, therefore, in a variety of electronic devices. The magnetic junction 100 includes a free layer 110 having magnetic moment 111, a nonmagnetic spacer layer 120, and a pinned layer 130 having magnetic moment 131. Also shown is an underlying substrate 101 in which devices including but not limited to a transistor may be formed. Bottom contact 102, top contact 108, optional seed layer(s) 104 and optional capping layer(s) 106 are also shown. As can be seen in FIG. 2, the pinned layer 130 is closer to the top (furthest from a substrate 101) of the magnetic junction 100 than the free layer 110 is. The pinned layer 130 is also deposited after the free layer 110. The magnetic junction 100 is, therefore, a top pinned junction. In alternate embodiments, the magnetic junction 100 could be a dual magnetic junction or a bottom pinned junction. For a dual magnetic junction, at least an additional (bottom) nonmagnetic spacer layer (not shown in FIG. 2) and an additional (bottom) pinned layer (not shown in FIG. 2) would be present between the free layer 110 and the optional seed layer(s) 104/bottom contact 102. An optional pinning layer (not shown) may be used to fix the magnetization (not shown) of the pinned layer 130. In some embodiments, the optional pinning layer may be an AFM layer or multilayer that pins the magnetization (not shown) of the pinned layer 130 by an exchange-bias interaction. However, in other embodiments, the optional pinning layer may be omitted or another structure may be used. Other layers including but not limited to polarization enhancement layers (PELs) having a high spin polarization, magnetic or nonmagnetic insertion layers, and/or other layers may be included in the layers of the magnetic junction 100 or be considered to be separate layers that may be used in the magnetic junction 100. However, such layers are not shown for simplicity.

The nonmagnetic spacer layer 120 may be an MgO tunneling barrier layer. The MgO layer may be crystalline and have a 200 orientation for enhanced tunneling magnetoresistance (TMR). In other embodiments, the nonmagnetic spacer layer may be a different tunneling barrier layer, may be a conductive layer or may have another structure.

The free layer 110 is magnetic and has a perpendicular magnetic anisotropy energy that exceeds the out-of-plane demagnetization energy. The free layer thus has a high perpendicular magnetic anisotropy (PMA). The magnetic moment 111 of the free layer 110 may thus be oriented perpendicular-to-plane as shown in FIG. 2. The magnetic junction is also configured such that the magnetic moment 111 of the free layer 110 may be switched using a current driven through the magnetic junction (e.g. using spin transfer). Although the free layer 110 is shown as a single layer, in some embodiments, the free layer 110 may be a multilayer. For example, the free layer 110 may be a SAF. The free layer 110 may also include multiple magnetic and/or nonmagnetic layers without being configured as a SAF structure.

The pinned layer 130 is magnetic. The pinned layer 130 may be part of a pinned structure, such as a SAF. In such embodiments, the pinned layer 130 would be one of the ferromagnetic layers interleaved with nonmagnetic layer(s). The pinned layer 130 may be a multilayer. Thus, the pinned layer 130 layer may also include sublayers including but not limited to multiple ferromagnetic layers. A polarization enhancement layer (PEL) having a high spin polarization may be provided at the portion of the pinned layer 130 nearest to the magnetic spacer layer 120. Like the free layer 110, the perpendicular magnetic anisotropy energy of the pinned layer 130 exceeds its out-of-plane demagnetization energy. Consequently, the magnetic moment 131 of the pinned layer 130 may be perpendicular-to-plane. In such embodiments, a pinning layer is generally not used.

One or more multilayers may reside in the free layer 110 and/or the pinned layer 130. Such a multilayer would include layers of a rare earth and transition metal (RE-TM) alloy layer interleaved with an amorphous magnetic transition metal alloy layer. Note that as used herein, an amorphous magnetic layer is amorphous as deposited. After annealing or other fabrication steps during formation of a magnetic junction, the amorphous magnetic layer may still be amorphous or may be at least partially crystallized, particularly if B is allowed to diffuse from the amorphous magnetic layer. For example, such a multilayer may include layers of CoTb (the RE-TM layer) interleaved with layers of FeB or CoFeB (the amorphous magnetic alloy layer). For example, the multilayer may include n repeats of a CoTb/FeB bilayer, where n is an integer greater than or equal to one. In some embodiments, n does not exceed seven. For example, n may be three. The CoTb is actually $Co_xTb_{1-x}$, where x is 0.4-0.5 in some embodiments. The CoFeB layers may have the following stoichiometry: Co: 1-30 atomic percent, Fe: 40-99 atomic percent and B: 1-50 atomic percent. In some such embodiments, the CoFeB layers may have concentrations as follows: Co 10-20 atomic percent, Fe: 60-90 atomic percent and B 10-30 atomic percent. The FeB layer may have Fe: 80-60 atomic percent and B: 20-40 atomic percent. In some embodiments, FeB having nominally twenty atomic percent B is desired. In some cases, there may be a gradient in the stoichiometry of the RE-TM alloy layer and/or the amorphous magnetic alloy may vary throughout the multilayer. For example, the RE-TM alloy layer may vary from forty atomic percent Co for the first bilayer to fifty atomic percent Co for the $n^{th}$ repeat of the bilayer. In such embodiments, the stoichiometry of the amorphous magnetic alloy may be substantially constant or may vary. Similarly, the amorphous magnetic alloy may have a stoichiometry that varies throughout the multilayer. In such embodiments, the stoichiometry of the RE-TM alloy may be substantially constant or may vary.

The layers of the bilayer may also be thin. For example, the CoTb and amorphous magnetic alloy layers may be at least two Angstroms and not more than five Angstroms thick. The RE-TM alloy layer may have the same thickness as or a different thickness from the amorphous magnetic alloy layers. In addition, there may be a gradient in thickness of the RE-TM alloy layers and/or the amorphous magnetic alloy layers in the multilayer. For example, the multilayer might include n repeats of a bilayer including nominally three Angstroms of CoTb and nominally 2.7 Angstroms of FeB. In such an embodiment, the thicknesses of the RE-TM alloy (e.g. CoTb) layer and the amorphous magnetic alloy (FeB) layer do not vary. In other embodiments, the thickness of the CoTb layer and/or the FeB or CoFeB layer may vary over repeats of the bilayer. For example, three repeats of the bilayer may include three, four and five Angstroms of CoTb in the first, second and third repeats of the bilayer.

In addition to the RE-TM alloy and amorphous magnetic alloy bilayers, the multilayer that is in the free layer 110 and/or the pinned layer 130 may include other layers. For example, the multilayer may include interfacial layer(s) and/or insertion layer(s). The pinned layer 130 or free layer 110 may include a PEL in addition to a multilayer. The PEL may include materials such as CoFeB or FeB and may have the stoichiometries described above. Typically, the interfacial and insertion layers are at the edges of the repeats of the bilayer. For example, a pinned layer may include a number of repeats of the bilayer, a PEL and an insertion layer between the last repeat of the bilayer and the PEL. In other embodiments, insertion layers may be placed between repeats of the bilayer. In some embodiments, the insertion layer(s) may be between the interfacial layer and the PEL, between the edge of the repeats of the bilayer and the interfacial layer, or between the bilayer and the PEL. The interfacial layer(s) may include magnetic materials such as CoFeB or FeB. These CoFeB or FeB interfacial layers may also have the stoichiometries discussed above.

The multilayers described above may have improved thermal stability. The multilayer/RE-TM alloy/amorphous magnetic bilayer(s) may have a nonzero perpendicular magnetic anisotropy to temperatures up to four hundred degrees Celsius. In some embodiments, the nonzero perpendicular magnetic anisotropy of the multilayer may persist at temperatures up to four hundred and fifty degrees Celsius or higher. As such, the multilayers are more thermally robust. Consequently, the free layer 110 and/or pinned layer 130 may also be more magnetically stable.

The multilayers may also allow the magnetic junction to have improved magnetic and electrical properties. The insertion layers may tailor coupling between the repeats of the bilayer and the PEL or interfacial layer. The insertion layers may also be used to inhibit or block diffusion of boron. The insertion layers may reduce or prevent the diffusion of the rare earth, such as Tb into the PEL or other layer(s). For example, the insertion layer may include Mg, Ta, W, Hf and/or similar materials. The insertion and/or interfacial layer(s) may improve the thermal endurance of the multilayer and, therefore, the thermal endurance of the pinned layer 130 and/or the free layer 110.

In some embodiments, only one of the free layer 110 and the pinned layer 130 includes the thermally robust multilayer described above. In other embodiments, both the free layer 110 and the pinned layer 130 may include the multilayer described above. However, the multilayers need not be the same in such embodiments. For example, a different number of repeats of the bilayer may be used in the free layer 110 than in the pinned layer 130. The interfacial and/or insertion layers may be present in one layer 110 or 130 and omitted in the other layer 130 or 110, respectively.

The pinned layer 130 and/or the free layer 110 may include layer(s) other than the multilayer and/or be part of other structures. For example, the pinned layer 130 may be part of a synthetic antiferromagnet. In such an embodiment, the SAF structure would include the pinned layer 130, a nonmagnetic layer and another ferromagnetic layer that is antiferromagnetically coupled with the pinned layer 130. The free layer 130 may also be a SAF or include other layers. Thus, although depicted as single layers, the layer(s) 110, 120 and 130 may include sublayers and/or other substructures.

The magnetic junction 100 may have improved performance. The free layer 110 and pinned layer 130 may have their magnetic moments oriented perpendicular-to-plane, which may be desirable for improved performance. This orientation may be due to the RE-TM alloy and amorphous magnetic alloy bilayer(s). Use of the bilayer(s), particularly with the insertion and/or interfacial layer(s) may also improve the thermal endurance of the multilayer and, therefore, the thermal endurance of the pinned layer 130 and/or the free layer 110. The magnetic junction 100 may be magnetically stable even for higher temperature anneals. As a result, portions of the magnetic junction 100 may be annealed at higher temperatures. Higher anneal temperatures may improve the crystal structure of the nonmagnetic spacer layer 120. For example, the nonmagnetic spacer layer 120 formed of MgO may have the desired crystal structure and 100 orientation. The improved crystal structure of the nonmagnetic spacer layer 120 may result in a larger tunneling magnetoresistance and thus a higher read signal. Further, use of the insertion layer(s) may reduce or block diffusion of B and/or rare earths such as Tb. This may improve the magnetic properties of the magnetic junction 100. The insertion layers may also attract oxygen from the nonmagnetic spacer layer 120, which may reduce the resistance area product. Consequently, performance of the magnetic junction 100 may be improved.

Figure 3:
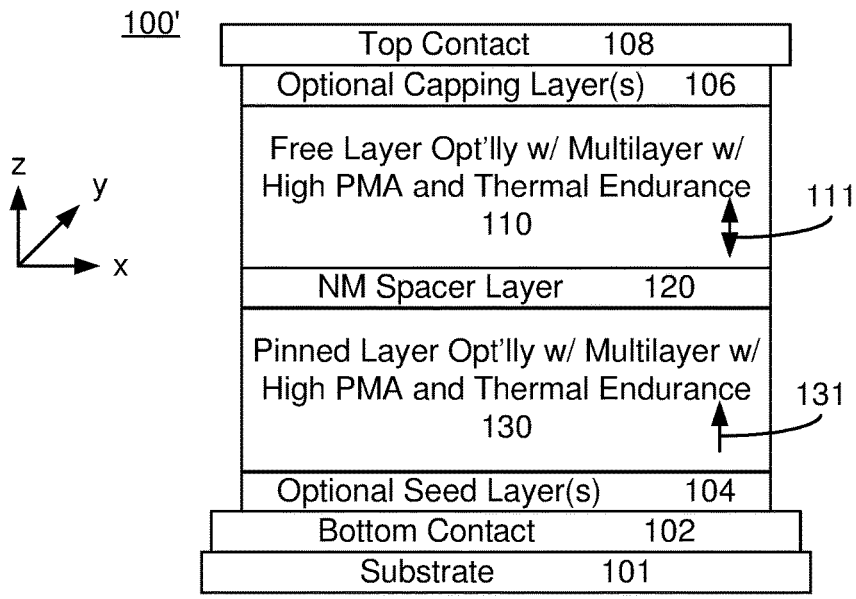
FIG. 3 depicts another exemplary embodiment of a magnetic junction including a high perpendicular magnetic anisotropy and thermally robust multilayer and usable in a magnetic memory programmable using spin transfer torque.

FIG. 3 depicts an exemplary embodiment of a magnetic junction 100' including a high perpendicular magnetic anisotropy and thermally robust multilayer and usable in a magnetic memory programmable using spin transfer torque, as well as surrounding structures. For clarity, FIG. 3 is not to scale. The magnetic junction 100' may be used in a magnetic device such as a STT-RAM and, therefore, in a variety of electronic devices. The magnetic junction 100' is analogous to the magnetic junction 100. Consequently, similar components have analogous labels. The magnetic junction 100' includes a free layer 110 having magnetic moment 111, a nonmagnetic spacer layer 120, and a pinned layer 130 having magnetic moment 131 that are analogous to the free layer 110 having magnetic moment 111, the nonmagnetic spacer layer 120, and the pinned layer 130 having magnetic moment 131, respectively, depicted in the magnetic junction 100. Thus, one or both of the layers 110 and 130 may include the multilayer(s) described above. Also shown are an underlying substrate 101, bottom contact 102, top contact 108, optional seed layer(s) 104 and optional capping layer(s) 106 that may be analogous to the substrate 101, bottom contact 102, top contact 108, optional seed layer(s) 104 and optional capping layer(s) 106 for the magnetic junction 100.

The magnetic junction 100' is a bottom pinned magnetic junction. In particular, the pinned layer 130 is closer to the substrate 101 than the free layer 110. Thus, the seed layer(s) 104 depicted in FIG. 3 might be different than the seed layer(s) of FIG. 2. The pinned layer 130 and/or the free layer 110 may include the multilayer(s) described above. In addition, although shown as simple layers, the pinned layer 130 and/or free layer 110 may include other structures and/or be part of another structure such as a SAF.

The magnetic junction 100' may share the benefits of the magnetic junction 100. For example, the free layer 110 and pinned layer 130 may have their magnetic moments oriented perpendicular-to-plane due to the RE-TM alloy and amorphous magnetic alloy bilayer(s). The thermal endurance of the pinned layer 130 and/or the free layer 110 may be enhanced because of the presence of the multilayers described above. Consequently, portions of the magnetic junction 100 may be annealed at higher temperatures. The crystal structure and orientation of the nonmagnetic spacer layer 120 may be improved, resulting in a higher tunneling magnetoresistance and read signal. Use of insertion and/or interfacial layers may also improve the crystal structure and magnetic properties of the magnetic junction 100'. Consequently, performance of the magnetic junction 100' may be improved.

Figure 4:
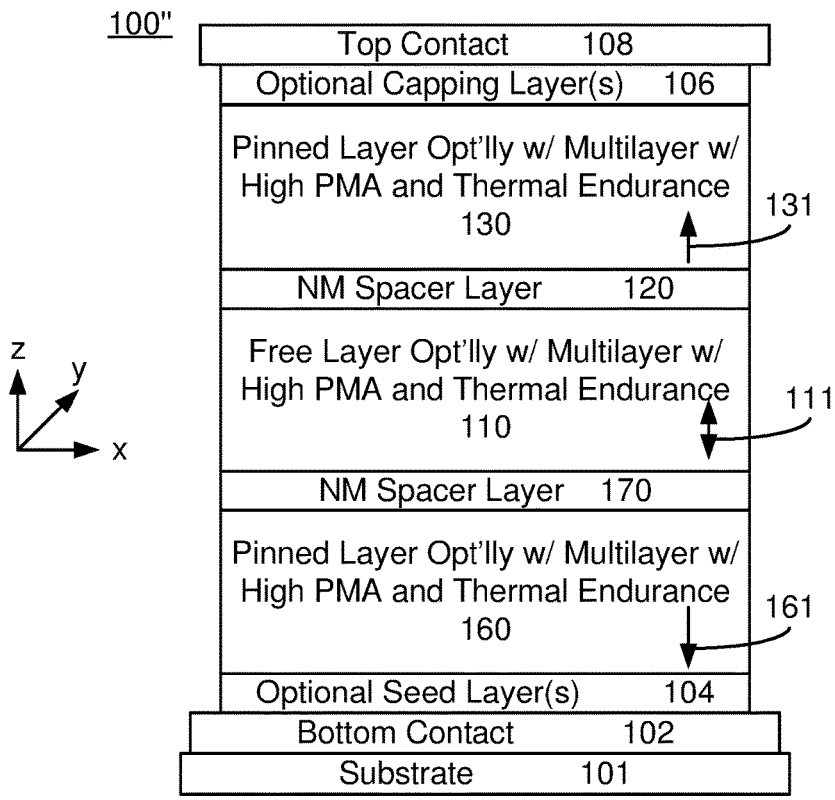
FIG. 4 depicts another exemplary embodiment of a magnetic junction including a high perpendicular magnetic anisotropy and thermally robust multilayer and usable in a magnetic memory programmable using spin transfer torque.

FIG. 4 depicts an exemplary embodiment of a magnetic junction 100" including a thin pinned layer and usable in a magnetic memory programmable using spin transfer torque, as well as surrounding structures. For clarity, FIG. 4 is not to scale. The magnetic junction 100" may be used in a magnetic device such as a STT-RAM and, therefore, in a variety of electronic devices. The magnetic junction 100" is analogous to the magnetic junction(s) 100 and/or 100'. Consequently, similar components have analogous labels. The magnetic junction 100" includes a free layer 110 having magnetic moment 111, a nonmagnetic spacer layer 120, and a pinned layer 130 having magnetic moment 131 that are analogous to the free layer 110 having magnetic moment 111, the nonmagnetic spacer layer 120, and the pinned layer 130 having magnetic moment 131, respectively, depicted in the magnetic junction 100. Also shown are an underlying substrate 101, bottom contact 102, top contact 108, optional seed layer(s) 104 and optional capping layer(s) 106 that may be analogous to the substrate 101, bottom contact 102, top contact 108, optional seed layer(s) 104 and optional capping layer(s) 106 for the magnetic junction 100. One or both of the layers 110 and 130 may include the multilayer(s) described above.

As can be seen in FIG. 4, the magnetic junction 100" also includes an additional (bottom) pinned layer 160 and an additional nonmagnetic (bottom) spacer layer 170. Thus, the magnetic junction 100" is a dual magnetic junction. The nonmagnetic spacer layer 170 is analogous to the nonmagnetic spacer layer 120. Thus, the nonmagnetic spacer layer 170 may be conductive, a tunneling barrier layer, or have another structure. If it is a tunneling barrier layer, the nonmagnetic spacer layer 170 may be desired to be crystalline MgO having a 100 orientation.

The pinned layer 160 has a magnetic moment 161 that is substantially fixed in place and may have a perpendicular magnetic anisotropy energy that exceeds the out-of-plane demagnetization energy. The pinned layer 160 may be a single layer or a multilayer. For example, the pinned layer 160 may include the multilayer having one or more repeats of the RE-TM alloy amorphous magnetic alloy bilayer. The insertion layer(s), interfacial layer(s) and/or PEL described above may also be used. In some embodiments, the pinned layer 160 may be a SAF or other analogous pinning structure. Other multilayers are also possible. In the embodiment shown, the pinned layers 130 and 160 are in a dual state, having magnetic moments 131 and 161, respectively, in opposite directions. In other embodiments, another state including but not limited to the antidual state (both moments 131 and 161 aligned) may be possible.

The magnetic junction 100" may share the benefits of the magnetic junction(s) 100 and/or 100'. For example, the layer(s) 110, 130 and/or 160 may have their magnetic moments oriented perpendicular-to-plane due to the RE-TM alloy and amorphous magnetic alloy bilayer(s). The thermal endurance of the layer(s) 110, 130 and/or 160 may be enhanced because of the presence of the multilayers described above. As a result, portions of the magnetic junction 100 may be annealed at higher temperatures. The crystal structure and orientation of the nonmagnetic spacer layers 120 and 170 may be improved, resulting in a higher tunneling magnetoresistance and read signal. Use of insertion and/or interfacial layers may also improve the crystal structure and magnetic properties of the magnetic junction 100'. Consequently, performance of the magnetic junction 100" may be enhanced.

Figure 5:
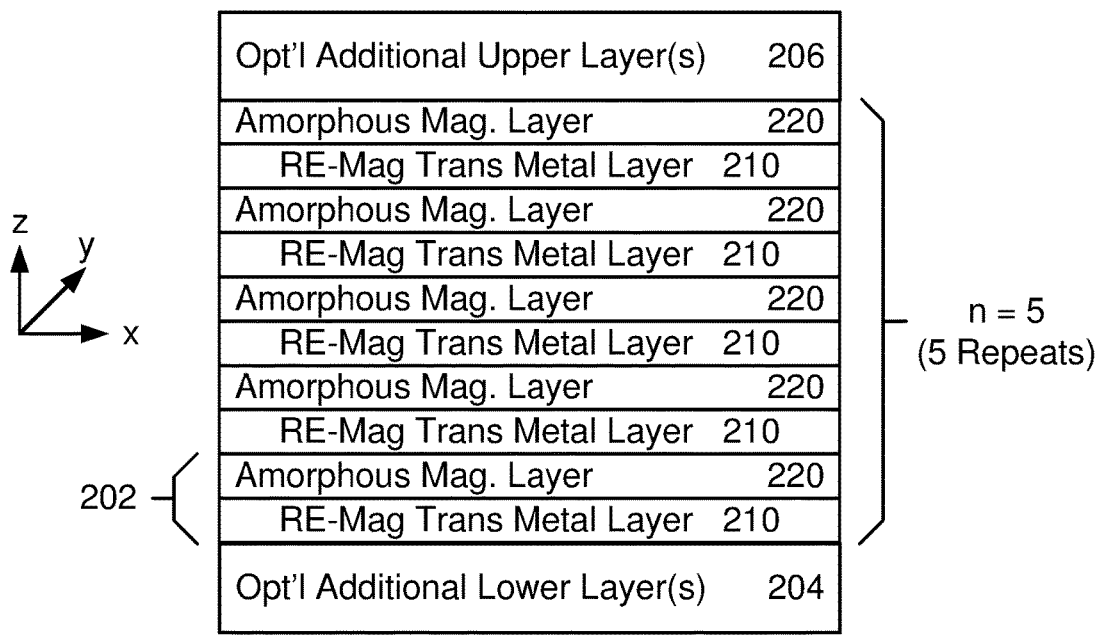
FIG. 5 depicts an exemplary embodiment of a high perpendicular magnetic anisotropy and thermally robust multilayer usable in a magnetic junction.

FIG. 5 depicts an exemplary embodiment of a high perpendicular magnetic anisotropy and thermally robust multilayer 200 usable in a magnetic junction, such as the magnetic junction 100, 100' and/or 100". For clarity, FIG. 5 is not to scale. The multilayer 200 may reside in the free layer 110 and/or the pinned layer 130. The multilayer 200 includes multiple repeats of a bilayer 202 as well as optional additional layers 204 and 206. The bilayer 202 include a RE-TM alloy layer 210 and an amorphous magnetic layer 220. For example, the RE-TM alloy layer 210 may be a CoTb layer having the stoichiometry described above. The amorphous magnetic alloy layer 220 may be a FeB layer or a CoFeB layer having the stoichiometry described above. However, in other embodiments, other material(s) may be used for one or both layers 210 and 220. The multilayer 200 includes n repeats of the bilayer 202, where n is an integer greater than or equal to one. In the embodiment shown, n is five. In some cases, each repeat of the bilayer 202 is the same. In other embodiments, one or both of the layers 210 and 220 may have a gradient in the stoichiometry and/or may use different materials. For example, the RE-TM alloy layer 210 may vary from forty atomic percent Co for the first bilayer to fifty atomic percent Co for the fifth of the bilayer. Alternatively, the RE-TM alloy layer 210 may include fifty atomic percent Co for three of the bilayers while two of the bilayers may include RE-TM alloy layers 210 that include forty atomic percent Co. The stoichiometry of the amorphous magnetic alloy layer 220 may be substantially constant or may vary. Similarly, the amorphous magnetic alloy layer 220 may have a stoichiometry that varies throughout the multilayer or may switch from one material (e.g. CoFeB) to another material (e.g. FeB). In such embodiments, the stoichiometry of the RE-TM alloy layer 220 may be substantially constant or may vary.

The layers 210 and 220 of the bilayer 202 may also be thin. For example, the layers 210 and 220 may each be at least two Angstroms and not more than five Angstroms thick. The RE-TM alloy layer 210 may have the same thickness as or a different thickness from the amorphous magnetic alloy layer 220. In addition, there may be a gradient in thickness of the RE-TM alloy layers 210 and/or the amorphous magnetic alloy layers 220.

In addition to the repeats of the bilayer 202, the multilayer 200 may include optional lower additional layers 204 and/or optional upper additional layers 206. In some cases, additional layers may be inserted between one or more repeats of the bilayer 202 and/or between the layers 210 and 220 in one or more repeats of the bilayer 202. The lower additional layers 204 may include the interfacial and/or insertion layer(s) described above. The optional additional upper layers 206 may include other insertion and/or interfacial layer(s) described above. The location and presence of the interfacial and insertion layers may depend upon the location of the multilayer 200. For example, if the multilayer 200 is used in a bottom pinned layer, then interfacial layers and/or insertion layers may be located in the optional additional upper layers 206. If the multilayer 200 is used in a top pinned layer, then interfacial layers and/or insertion layers may be located in the optional additional lower layers 204. If the multilayer 200 is used in a free layer then interfacial and/or insertion layers may be in both locations 204 and 206. For example, in a dual magnetic junction, an interfacial layer may be in both locations 204 and 206, but the insertion layers may be omitted. In other embodiments, the insertion layers may be in one or both locations 204 and 206 if the multilayer 200 is used in the free layer of a dual magnetic junction.

The multilayer 200 may allow a magnetic junction, such as the magnetic junction(s) 100, 100' and/or 100", to have improved performance. Because of the bilayer 202, the multilayer 200 has its magnetic moment (not shown in FIG. 5) oriented perpendicular-to-plane (along the z axis). This orientation is desirable for spin-transfer torque switching of the free layer. Because of the materials used in the bilayer and, in some embodiments, the additional layers 204 and/or 206, the thermal endurance of the multilayer 200 may be enhanced. For example, the multilayer 200 may have a nonzero perpendicular magnetic anisotropy to temperatures up to the temperatures described above. As a result, portions of the magnetic junction in which the multilayer 200 is used may be annealed at higher temperatures. The crystal structure and orientation of the MgO tunneling barrier layers used as the nonmagnetic spacer layers may be improved. A higher tunneling magnetoresistance and read signal may be achieved. Use of insertion and/or interfacial layers may also improve the crystal structure and magnetic properties of the magnetic junction using the multilayer 200. Consequently, performance of the magnetic junction utilizing the multilayer 200 may be enhanced.

Figure 6:
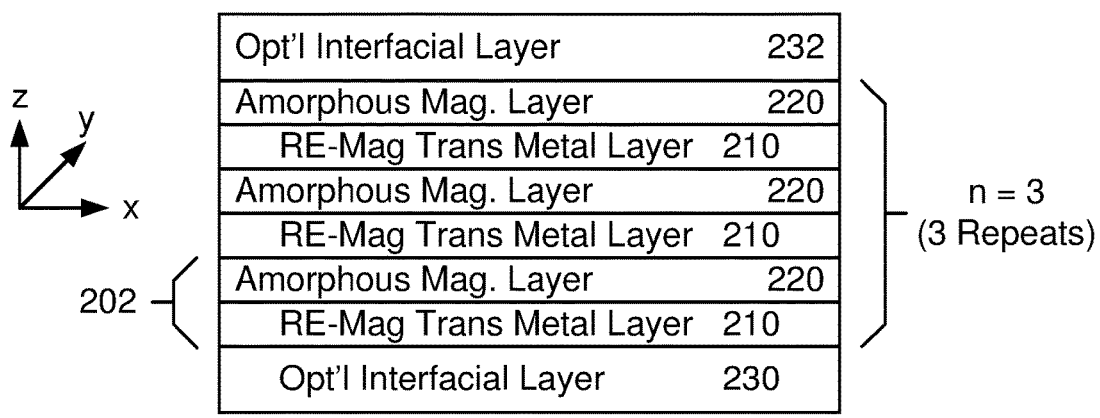
FIG. 6 depicts another exemplary embodiment of a high perpendicular magnetic anisotropy and thermally robust multilayer usable in a magnetic junction.

FIG. 6 depicts an exemplary embodiment of a high perpendicular magnetic anisotropy and thermally robust multilayer 200' usable in a magnetic junction such as the magnetic junction 100, 100' and/or 100". For clarity, FIG. 6 is not to scale. The multilayer 200' may reside in the free layer 110 and/or the pinned layer 130. In some embodiments, the multilayer 200' is specifically in the free layer 110. In some such embodiments, the free layer consists of the multilayer 200'. The multilayer 200' may be a free layer of a dual magnetic tunneling junction such as the magnetic junction 100" in which the nonmagnetic spacer layers 120 and 170 are MgO tunneling barrier layers. Alternatively, the multilayer 200' could be the free layer of a top pinned magnetic junction such as the junction 100 or the free layer of a bottom pinned magnetic junction such as the magnetic junction 100'. If the multilayer 200' is in the free layer of a top pinned magnetic junction (i.e. the free layer is closest to the substrate), then the multilayer 200' may reside on a seed layer, such as an MgO seed layer. If the multilayer 200' is in the free layer of a bottom pinned magnetic junction (i.e. the free layer is further to the substrate), then a capping layer, such as an MgO capping layer, may be on the multilayer 200'. The MgO seed or capping layer may enhance the perpendicular magnetic anisotropy.

The multilayer 200' is analogous to the multilayer 200. Consequently, similar components have analogous labels. The multilayer 200' thus includes a bilayer 202 having a RE-TM alloy layer 210 and an amorphous magnetic layer 220. In the embodiment shown, the multilayer 200' includes three repeats of the bilayer 202 (n=3). In addition, the multilayer 200' includes one or both interfacial layers 230 and 232. In some embodiments, therefore, only one interfacial layer 230 or 232 is present. In other embodiments, both interfacial layers 230 and 232 are present. The interfacial layers 230 and 232 are amorphous magnetic layers, such as CoFeB and/or FeB in the stoichiometries discussed above. The thicknesses of the interfacial layers 230 and 232 is analogous to that of the amorphous magnetic layer 220. Thus, the interfacial layers 230 and 232 may be at least two Angstroms thick and not more than five Angstroms thick. For example, the interfacial layer 230 and/or 232 might be nominally four Angstroms thick. For a dual magnetic tunneling junction, the interfacial layers 230 and/or 232 may be desired to adjoin the tunneling barrier layer(s). Thus, the free layer in such a magnetic tunneling junction may consist of the multilayer 200'.

The multilayer 200' may share the benefits of the multilayer 200. For example, the multilayer 200' may have a nonzero perpendicular magnetic anisotropy up to the temperatures described above. Higher anneal temperatures may be used, thereby improving the crystal structure and orientation of the MgO tunneling barrier layers. Thus, magnetoresistance, spin transfer switching and read signal may be improved. Magnetoresistance may also be improved by the use of the interfacial layers 230 and 232. Consequently, performance of the magnetic junction utilizing the multilayer 200' may be enhanced.

Figure 7:
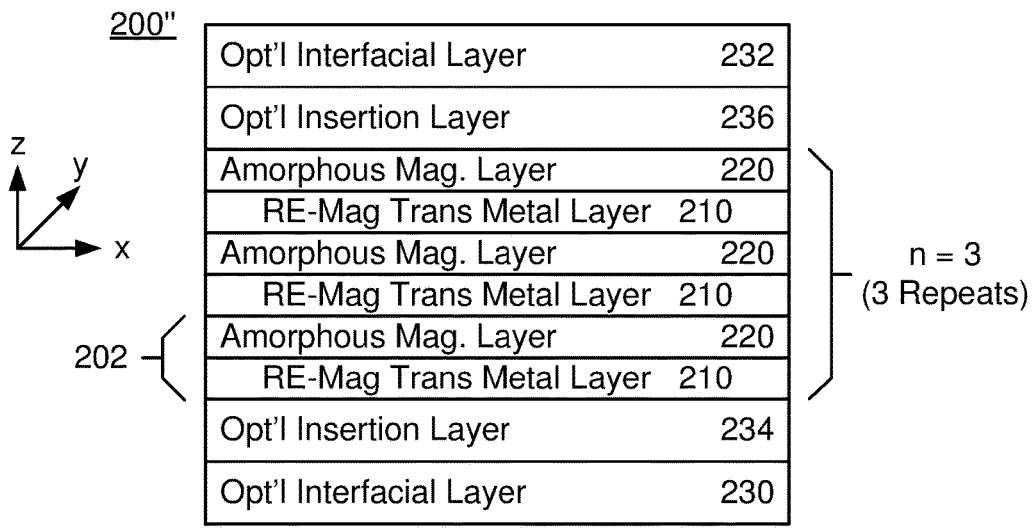
FIG. 7 depicts another exemplary embodiment of a high perpendicular magnetic anisotropy and thermally robust multilayer usable in a magnetic junction.

FIG. 7 depicts an exemplary embodiment of a high perpendicular magnetic anisotropy and thermally robust multilayer 200" usable in a magnetic junction such as the magnetic junction 100, 100' and/or 100". For clarity, FIG. 7 is not to scale. The multilayer 200" may reside in the free layer 110 and/or the pinned layer 130. In some embodiments, the multilayer 200" is specifically in the free layer 110. In some such embodiments, the free layer consists of the multilayer 200". The multilayer 200' may be a free layer of a dual magnetic tunneling junction such as the magnetic junction 100" in which the nonmagnetic spacer layers 120 and 170 are MgO tunneling barrier layers. Alternatively, the multilayer 200" could be the free layer of a top pinned magnetic junction such as the junction 100 or the free layer of a bottom pinned magnetic junction such as the magnetic junction 100'. If the multilayer 200" is in the free layer of a top pinned magnetic junction, then the multilayer 200" may reside on a seed layer, such as an MgO seed layer. If the multilayer 200" is in the free layer of a bottom pinned magnetic junction, then a capping layer, such as an MgO capping layer, may be on the multilayer 200".

The multilayer 200" is analogous to the multilayer 200 and 200'. Consequently, similar components have analogous labels. The multilayer 200" thus includes a bilayer 202 having a RE-TM alloy layer 210 and an amorphous magnetic layer 220. In the embodiment shown, the multilayer 200" includes three repeats of the bilayer 202 (n=3). The multilayer 200" includes one or both interfacial layers 230 and 232 that are analogous to the interfacial layers 230 and 232 depicted in FIG. 6.

The multilayer 200" also includes one or both insertion layers 234 and 236. In some embodiments, only one of the insertion layers 234 or 236 is present. In other embodiments, both insertion layers 234 and 236 are present. The insertion layers 234 and 236 are nonmagnetic and may have an affinity for boron and/or a rare earth such as Tb. For example, the insertion layers 234 and 236 may consist of W, Ta and/or Hf. The thicknesses of the insertion layers 234 and 236 may be at least two Angstroms and not more than ten Angstroms. In some such embodiments, the insertion layers 234 and 236 are at least three Angstroms thick and not more than five Angstroms thick.

The multilayer 200" may share the benefits of the multilayers 200 and/or 200'. For example, the multilayer 200" may have a nonzero perpendicular magnetic anisotropy up to the temperatures described above, allowing for an improved crystal structure and orientation of the MgO tunneling barrier layers in the magnetic junctions. Thus, magnetoresistance, spin transfer switching and read signal may be improved. Magnetoresistance may also be improved by the use of the interfacial layers 230 and 232. The insertion layers 234 and 236 may reduce the B in the interfacial layer(s) 230 and 232, may block the diffusion of a rare earth such as Tb, and may attract oxygen from the MgO tunneling barrier layers. Interfacial layers 230 and 232 may be more crystalline after annealing. The crystallinity of the interfacial layer(s) 230 and 232 and the tunneling barrier layers such as layers 120 and 170 may be improved. Tunneling magnetoresistance and read signal may be increased. The resistance area product (RA) may also be reduced by the insertion layers 234 and/or 236 attracting oxygen from a nearby tunneling barrier layer. Consequently, performance of the magnetic junction utilizing the multilayer 200" may be enhanced.

Figure 8:
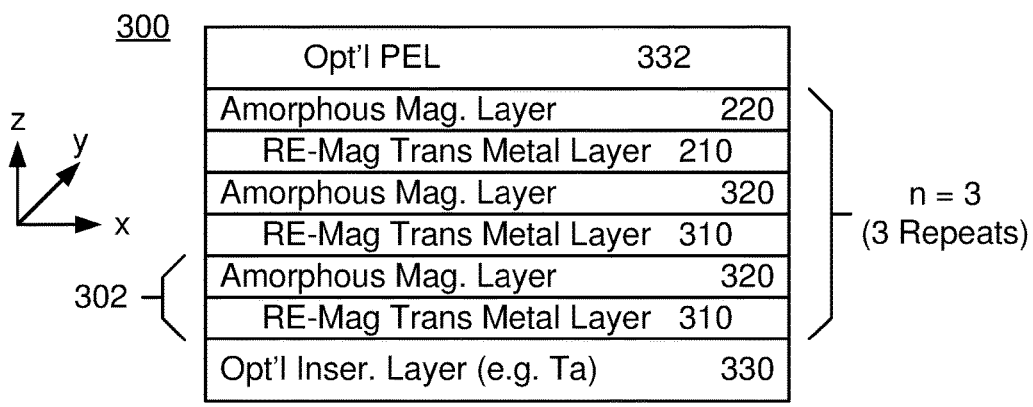
FIG. 8 depicts another exemplary embodiment of a high perpendicular magnetic anisotropy and thermally robust multilayer usable in a magnetic junction.

FIG. 8 depicts an exemplary embodiment of a high perpendicular magnetic anisotropy and thermally robust multilayer 300 usable in a magnetic junction such as the magnetic junction 100, 100' and/or 100". For clarity, FIG. 8 is not to scale. The multilayer 300 may reside in the pinned layer 130 and/or 160. In some such embodiments, the pinned layer 130 and/or 160 consists of the multilayer 300. Thus, an optional PEL 332 is also shown. The PEL 332 is desired to be closest to the nonmagnetic spacer layer (e.g. tunneling barrier layer) of the magnetic junction in which the multilayer 300 is used. In the location shown in FIG. 8, the multilayer 300 would be in a bottom pinned layer. If used in a top pinned layer, the PEL 332 would be below the multilayer 332, adjacent to the optional insertion layer 330. The multilayer 300 may be in pinned layer(s) of a dual magnetic tunneling junction such as the magnetic junction 100", a pinned layer of a top pinned magnetic junction such as the junction 100, or the pinned layer of a bottom pinned magnetic junction such as the magnetic junction 100'. If the multilayer 300 is in a bottom pinned magnetic junction, then the multilayer 200" may reside on a seed layer.

The multilayer 300 is analogous to the multilayers 200, 200', 200" and 200'. Consequently, similar components have analogous labels. The multilayer 300 thus includes a bilayer 302 having a RE-TM alloy layer 310 and an amorphous magnetic layer 320. The bilayer 302 is analogous to the bilayer 202. In the embodiment shown, the multilayer 300 includes three repeats of the bilayer 302 (n=3). The multilayer 300 includes an optional insertion layer 330. The insertion layer 330 is a nonmagnetic layer analogous to the insertion layers 234 and 236. Thus, the insertion layer 330 may have an affinity for B. Thus, materials such as Ta, Mg and/or Hf may be used. In the embodiment shown, the optional insertion layer 330 may be function as a seed layer. As such, Ta may be preferred for the layer 330 in the multilayer 300. The insertion layer 330 may be at least two Angstroms and not more than ten Angstroms. In some such embodiments, the insertion layer/seed layer 330 is at least three Angstroms thick and not more than five Angstroms thick.

The multilayer 300 may share the benefits of the multilayers 200, 200' and/or 200". For example, the multilayer 300 may have a nonzero perpendicular magnetic anisotropy up to the temperatures described above, allowing for an improved crystal structure and orientation of the MgO tunneling barrier layers in the magnetic junctions. Thus, magnetoresistance, spin transfer switching and read signal may be improved. Magnetoresistance may also be improved by the use of the insertion layer 330. Consequently, performance of the magnetic junction utilizing the multilayer 300 may be enhanced.

Figure 9:
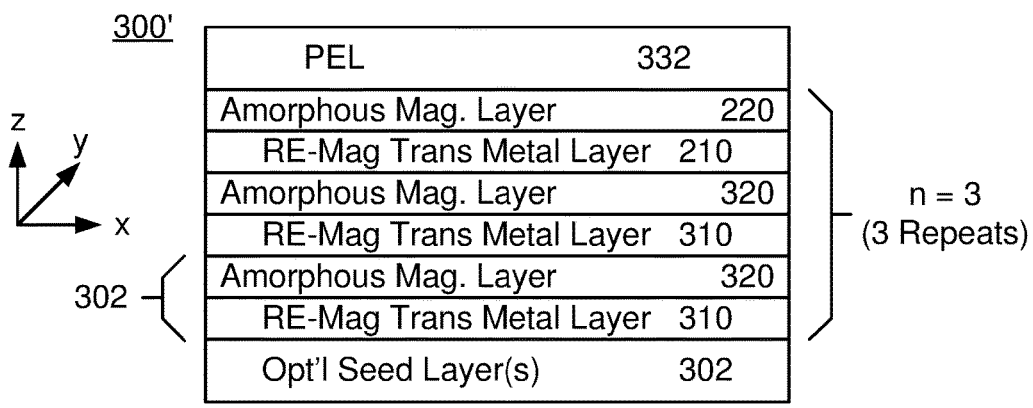
FIG. 9 depicts another exemplary embodiment of a high perpendicular magnetic anisotropy and thermally robust multilayer usable in a magnetic junction.

FIG. 9 depicts an exemplary embodiment of a high perpendicular magnetic anisotropy and thermally robust multilayer 300' usable in a magnetic junction such as the magnetic junction 100, 100' and/or 100". For clarity, FIG. 9 is not to scale. Also shown is optional PEL 332. The multilayer 300' may reside in the pinned layer(s) 130 and/or 160. In some such embodiments, the pinned layer consists of the multilayer 300' and the optional PEL 332. In the embodiment shown, the multilayer 300' may be used in a bottom pinned layer, such as the pinned layer 130 in the magnetic junction 100' or the pinned layer 160. Thus, a seed layer 302 is shown in place of an optional insertion layer 330. In some embodiments, the seed layer 302 is a Ta seed layer.

The multilayer 300' is analogous to the multilayer 300. Consequently, similar components have analogous labels. The multilayer 300' thus includes a bilayer 302 having a RE-TM alloy layer 310 and an amorphous magnetic layer 320. In the embodiment shown, the multilayer 300' includes three repeats of the bilayer 302 (n=3).

The multilayer 300' may share the benefits of the multilayers 200, 200', 200" and/or 300. For example, the multilayer 300' may have a nonzero perpendicular magnetic anisotropy up to the temperatures described above, allowing for an improved crystal structure and orientation of the MgO tunneling barrier layers in the magnetic junctions. Thus, magnetoresistance, spin transfer switching and read signal may be improved. Consequently, performance of the magnetic junction utilizing the multilayer 300' may be enhanced.

Figure 10:
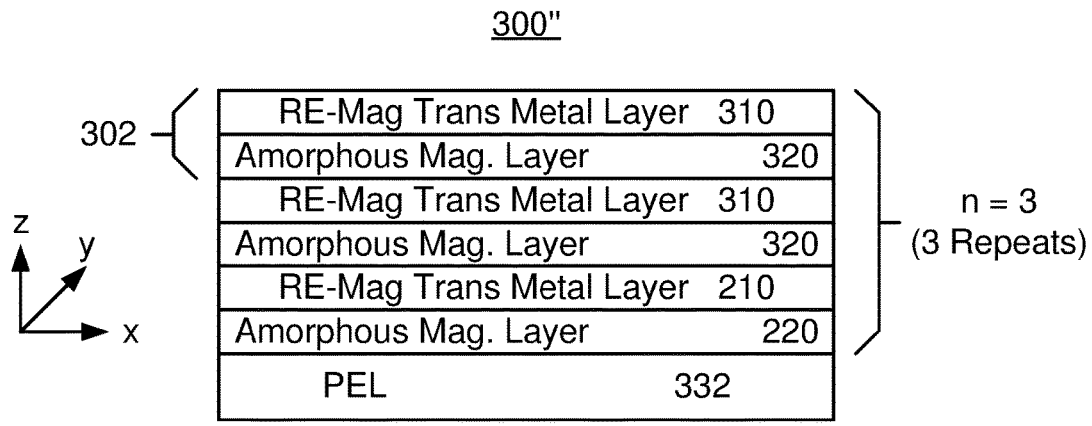
FIG. 10 depicts another exemplary embodiment of a high perpendicular magnetic anisotropy and thermally robust multilayer usable in a magnetic junction.

FIG. 10 depicts an exemplary embodiment of a high perpendicular magnetic anisotropy and thermally robust multilayer 300" usable in a magnetic junction such as the magnetic junction 100, 100' and/or 100". For clarity, FIG. 10 is not to scale. Also shown is optional PEL 332. The multilayer 300" may reside in the pinned layer 130 of the magnetic junctions 100 or 100". In some such embodiments, the pinned layer consists of the multilayer 300' and the optional PEL 332. In the embodiment shown, the multilayer 300' may be used in a top pinned layer. Thus, although not shown, a capping layer may be placed on the multilayer. Further, the PEL 332, if present, is below the multilayer 300'. Note that in some embodiments, the pinned layer 300" may be used in conjunction with the pinned layer 300' in a dual magnetic junction. The pinned layer 300' may be the bottom pinned layer while the pinned layer 300" may be the top pinned layer. The free layer used might include the multilayer 200, 200', 200" and/or other constituent(s).

The multilayer 300" is analogous to the multilayers 300 and 300'. Consequently, similar components have analogous labels. The multilayer 300" thus includes a bilayer 302 having a RE-TM alloy layer 310 and an amorphous magnetic layer 320. In the embodiment shown, the multilayer 300' includes three repeats of the bilayer 302 (n=3).

The multilayer 300" may share the benefits of the multilayers 200, 200', 200'", 300 and/or 300'. For example, the multilayer 300" may have a nonzero perpendicular magnetic anisotropy up to the temperatures described above, allowing for an improved crystal structure and orientation of the MgO tunneling barrier layers in the magnetic junctions. Thus, magnetoresistance, spin transfer switching and read signal may be improved. Consequently, performance of the magnetic junction utilizing the multilayer 300" may be enhanced.

Figure 11:
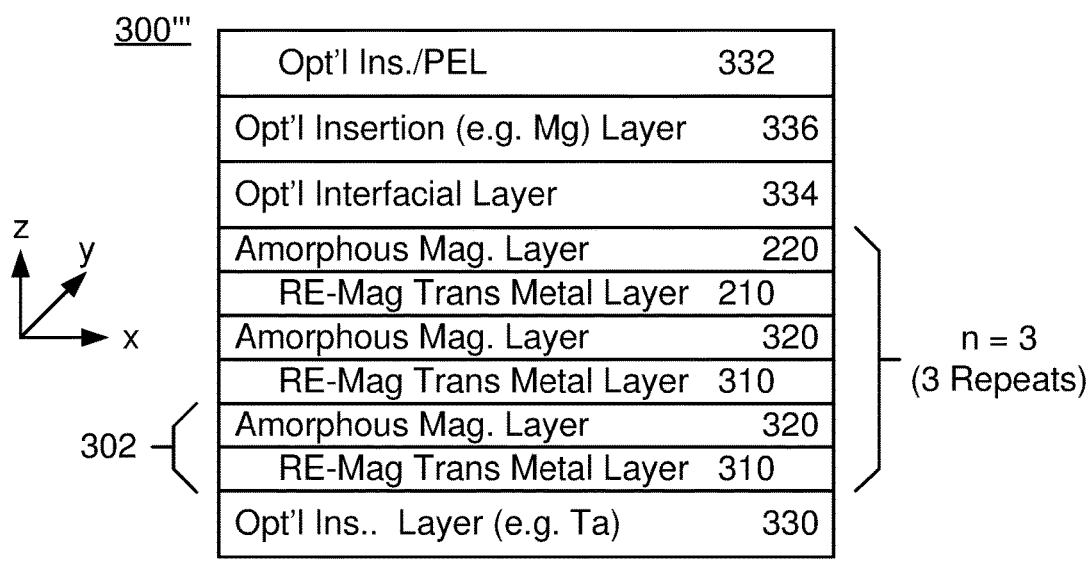
FIG. 11 depicts another exemplary embodiment of a high perpendicular magnetic anisotropy and thermally robust multilayer usable in a magnetic junction.

FIG. 11 depicts an exemplary embodiment of a high perpendicular magnetic anisotropy and thermally robust multilayer 300''' usable in a magnetic junction such as the magnetic junction 100, 100' and/or 100". For clarity, FIG. 11 is not to scale. Also shown is optional PEL 332. The multilayer 300''' may reside in the pinned layer 130 or 160 of the magnetic junctions 100, 100' and/or 100". In some such embodiments, the pinned layer consists of the multilayer 300''' and the optional PEL 332. The multilayer 300''' is analogous to the multilayers 300, 300' and 300". Consequently, similar components have analogous labels. The multilayer 300''' thus includes a bilayer 302 having a RE-TM alloy layer 310 and an amorphous magnetic layer 320. In the embodiment shown, the multilayer 300''' includes three repeats of the bilayer 302 (n=3).

The multilayer 300''' also includes an optional insertion layers 330 and 336 as well as optional interfacial layer 334. The insertion layers 330 and 336 are analogous to the layers 234 and 236. Thus, the layers 330 and 336 may include (or consist of) materials such as Ta, W, Mg and/or Hf. The optional interfacial layer 334 is analogous to the interfacial layers 230 and 232. Thus, the optional interfacial layer 334 may include material(s) such as CoFeB and/or FeB as discussed above.

In the embodiment shown, the multilayer 300''' may be used in a bottom pinned layer. Thus, the PEL 332, if present, is on the multilayer 300". In addition, the optional layers 334 and 336, described below, are on the repeats of the bilayer 302. However, if the multilayer 300''' is to be used in a top pinned layer, the layers 334, 336 and 332 may be below the repeats of the bilayer 302, replacing the layer 330. In such an embodiment, the layer 334 is closest to the bilayers 302 and the layer 336 furthest from the bilayers 302. Note that any combination of the layers 330, 332, 334 and 336 (including none) may be present in the magnetic junction 300'''. Further, in some cases, the thicknesses of the layers 330, 332, 334 and 336 may depend upon whether they are present in a top pinned layer or a bottom pinned layer. For example, the insertion layer 336 might consist of at least two Angstroms and not more than four Angstroms of Mg for a top pinned layer, but at least four Angstroms and not more than six Angstroms of Mg for a bottom pinned layer. In other embodiments, other thicknesses and/or materials are possible. For example, a Ta layer or an Mg/Ta/Mg trilayer could be used for the insertion layer 336.

Note that the insertion layer 336 is between the PEL 332 and the interfacial layer 334/bilayers 302. The insertion layer 336 may thus serve as a B sink, reducing or eliminating diffusion of B from the PEL 332 and/or interfacial layer 334. Further, the insertion layer 336 may act as an oxygen getter. Such a layer may be used to tailor the RA of the magnetic junction by attracting oxygen from the nearby tunneling barrier layer (not shown in FIG. 11). The insertion layer 336 may also function as a blocking layer that prevents diffusion of the rare earth (such as Tb) through the layer 336. Note that in an embodiment in which a Co/Pt bilayer is used in lieu of the bilayer 302, the insertion layer 336 may also be a Pt blocker. Thus, the efficiency of spin transfer switching and magnetoresistance may be improved. The insertion layer 336 may also be used to tailor the magnetic coupling between the bilayers 302 and the PEL 332. For example, a thicker insertion layer 336 may reduce the magnetic coupling. Thus, the insertion layer 336 may also be used to magnetically configure the pinned layer in which the multilayer 300''' is used.

The multilayer 300''' may share the benefits of the multilayers 200, 200', 200'', 300, 300' and/or 300''. For example, the multilayer 300''' may have a nonzero perpendicular magnetic anisotropy up to the temperatures described above, allowing for an improved crystal structure and orientation of the MgO tunneling barrier layers in the magnetic junctions. Thus, magnetoresistance, spin transfer switching and read signal may be improved. The presence of the insertion layer 336 may also improve RA, spin transfer switching, magnetoresistance and magnetic coupling of the magnetic junction. Consequently, performance of the magnetic junction utilizing the multilayer 300''' may be enhanced.

Various multilayers 200, 200', 200'', 300, 300', 300'' and 300''' having various features have been described. Characteristics of the multilayers 200, 200', 200'', 300, 300', 300'' and/or 300''' may be combined in the free layer and/or pinned layer(s) of a magnetic junction to attempt to achieve the performance desired. It is also noted that another bulk perpendicular magnetic anisotropy bilayer, such as Co/Pt, might be used in lieu of the RE-TM layer/amorphous magnetic layer bilayer. Thus, although certain multilayers 200, 200', 200'', 300, 300', 300'' and 300''' are described as more appropriate for free or pinned layers, nothing prevents their use in other layers.

Figure 12:
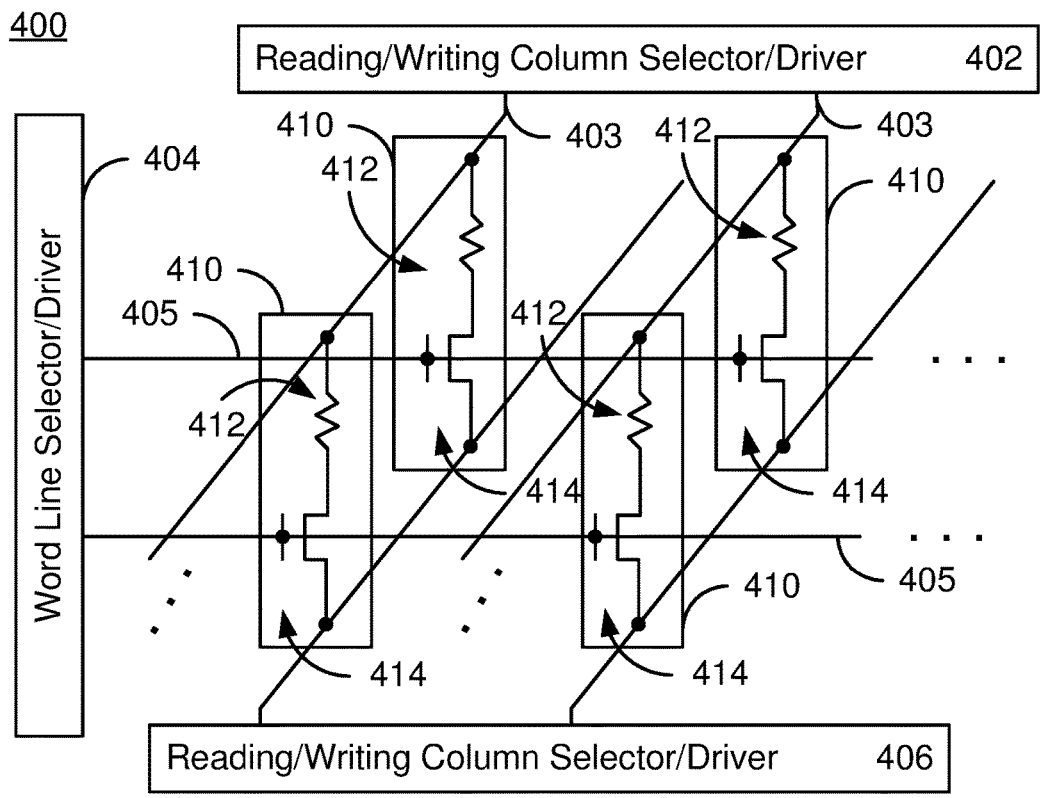
FIG. 12 depicts an exemplary embodiment of a memory utilizing magnetic junctions in the memory element(s) of the storage cell(s).

FIG. 12 depicts an exemplary embodiment of a memory 400 that may use one or more of the magnetic junctions 100, 100' and/or 100'' including multilayer(s) 200, 200', 200'', 300, 300', 300'' and/or 300'''. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 100' and/or 100'' including multilayer(s) 200, 200', 200'', 300, 300', 300'' and/or 300''' described herein. Although one magnetic junction 412 is shown per cell 410, in other embodiments, another number of magnetic junctions 412 may be provided per cell. As such, the magnetic memory 400 may enjoy the benefits described above.

Figure 13:
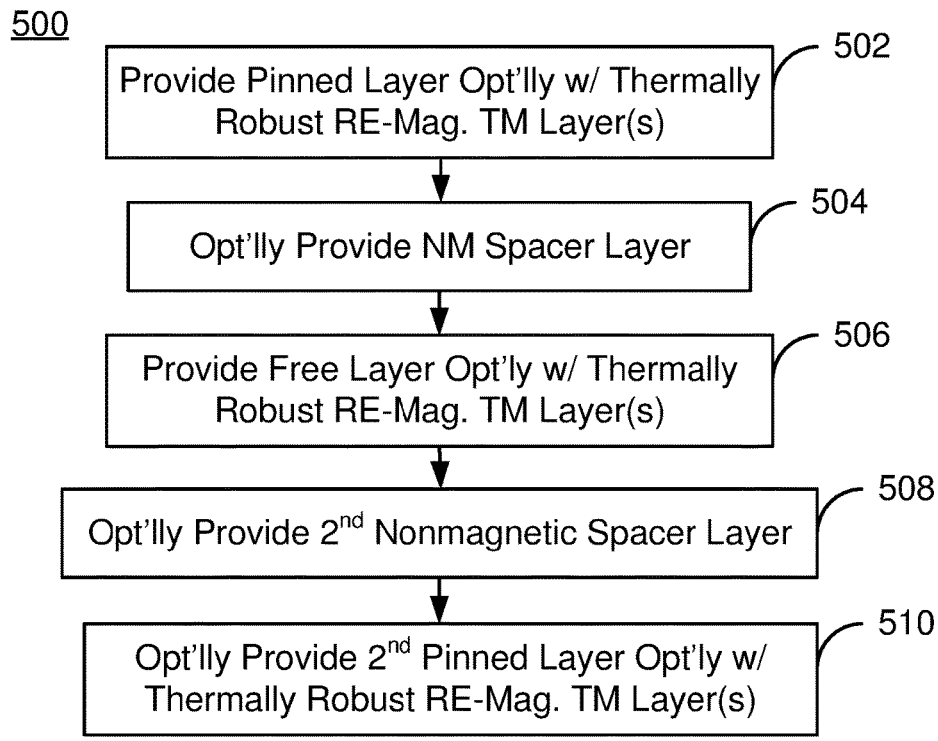
FIG. 13 is a flow chart depicting an exemplary embodiment of a method for providing a magnetic junction including a high perpendicular magnetic anisotropy and thermally robust multilayer and usable in a magnetic memory programmable using spin transfer torque.

FIG. 13 depicts an exemplary embodiment of a method 500 for fabricating a magnetic junction including a high perpendicular magnetic anisotropy and thermally robust multilayer and usable in a magnetic memory programmable using spin transfer torque, such as a STT-RAM and, therefore, in a variety of electronic devices. For simplicity, some steps may be omitted, performed in another or combined. Further, the method 300 may start after other steps in forming a magnetic memory have been performed. For simplicity, the method 300 is described in the context of the magnetic junctions 100 and 100''. However, other magnetic junctions may be formed.

A bottom pinned layer may optionally be provided, via step 502. The bottom pinned layer may be the layer 130 in the magnetic junction 100' or the layer 160 in the magnetic junction 100''. The bottom pinned layer provided in step 502 may include a thermally robust multilayer such as the multilayer 200, 200', 200'', 300, 300', 300'' and/or 300'''. Thus, in some embodiments, the bottom pinned layer includes multiple repeats of a RE-TM layer and an amorphous magnetic layer. Insertion and/or interfacial layers may also be present. Alternatively, another pinned layer might be provided. For example, multiple repeats of a Co/Pt bilayer may be deposited in step 502. The pinned layer provided may have a high perpendicular magnetic anisotropy (perpendicular magnetic anisotropy energy exceeding out-of-plane demagnetization energy). Step 502 may also include providing a PEL. Thus, step 502 may include depositing multiple layers.

The nonmagnetic spacer layer, such as the layer 120 or 170 may optionally be provided, via step 504. Step 504 may include depositing an MgO layer and/or depositing and oxidizing an Mg layer. A tunneling barrier layer may thus be provided. In other embodiments, another nonmagnetic spacer layer may be used. Step 504 is performed if the magnetic junction being formed is a dual magnetic junction or a bottom pinned magnetic junction.

The free layer, such as the free layer 110, is provided, via step 506. If steps 502 and 504 were performed, then the magnetic junction being fabricated may be a bottom pinned or dual magnetic junction. The free layer provided in step 506 may include a thermally robust multilayer such as the multilayer 200, 200', 200'', 300, 300', 300'' and/or 300'''. Thus, in some embodiments, the free layer includes multiple repeats of a RE-TM layer and an amorphous magnetic layer. Insertion and/or interfacial layers may also be present. The free layer has a high perpendicular magnetic anisotropy. Thus, the free layer formed in step 506 may have a perpendicular-to-plane magnetic moment.

A nonmagnetic spacer, such as the layer 120 may optionally be provided, via step 508. Step 508 may include depositing an MgO layer and/or depositing and oxidizing an Mg layer. A tunneling barrier layer may thus be provided. In other embodiments, another nonmagnetic spacer layer may be used. Step 508 is performed if the magnetic junction being formed is a dual magnetic junction or a top pinned magnetic junction.

A top pinned layer may optionally be provided, via step 510. The top pinned layer may be the layer 130 in the magnetic junction 100 or 100". The top pinned layer provided in step 510 may include a thermally robust multilayer such as the multilayer 200, 200', 200", 300, 300', 300" and/or 300'". Thus, in some embodiments, the top pinned layer includes multiple repeats of a RE-TM layer and an amorphous magnetic layer. Insertion and/or interfacial layers may also be present. Alternatively, another pinned layer might be provided. For example, multiple repeats of a Co/Pt bilayer may be deposited in step 510. The pinned layer provided may have a high perpendicular magnetic anisotropy (perpendicular magnetic anisotropy energy exceeding out-of-plane demagnetization energy). Step 510 may also include providing a PEL closer to the nonmagnetic spacer layer than the thermally robust multilayer. Thus, step 510 may include depositing multiple layers.

Although steps 502, 504, 506, 508 and 510 are described as providing specific layers, the edges of each layer is typically not defined until the entire stack has been deposited. The edges of the pinned layer(s), nonmagnetic spacer layer(s) and free layer may be defined at a different time than these layers are deposited. Thus, the steps 502, 504, 506, 508 and 510 may be spread out in time. However, in an alternate embodiment, one or more of the steps 502, 504, 506, 508 and 510 may include not only depositing the layer but also immediately defining the edges of the layer. Further, the formation of the nonmagnetic spacer layer in step(s) 504 and/or 508 may include annealing at least part of the magnetic junction that has been formed. Because the anneal may occur well after deposition of the tunneling barrier layer, this anneal may be considered part of another step, including but not limited to the formation of the pinned layer in step 510.

Using the method 500, the magnetic junction 100, 100' and/or 100" may be formed. Thus, the benefits of the magnetic junction(s) 100, 100' and/or 100" using one or more of the multilayers 200, 200', 200", 300, 300', 300", 300'" may be achieved. In particular, a multilayer having a perpendicular magnetic anisotropy energy that exceeds the out-of-plane demagnetization energy may be achieved and is thermally robust may be provided. The magnetic junction 100, 100' and/or 100" may be annealed at a higher temperature. For example, anneals at temperatures of up to 400 degrees Celsius, 450 Degrees Celsius or higher might be allowed. Consequently, the magnetoresistance may be improved.

Figure 14:
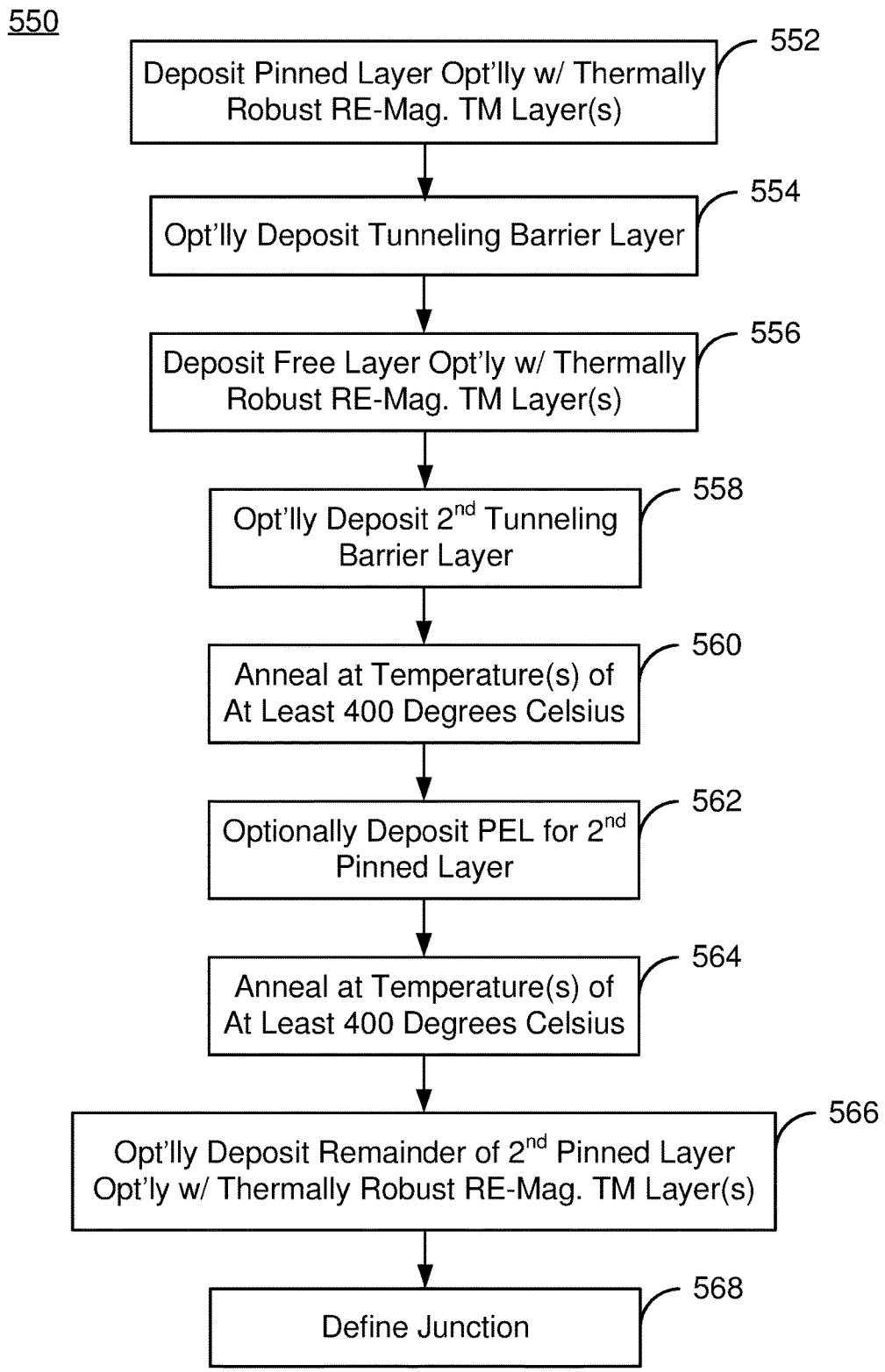
FIG. 14 is a flow chart depicting another exemplary embodiment of a method for providing a magnetic junction including a high perpendicular magnetic anisotropy and thermally robust multilayer and usable in a magnetic memory programmable using spin transfer torque.

FIG. 14 depicts another exemplary embodiment of a method 550 for fabricating a magnetic junction including a thermally robust multilayer in the pinned and/or free layer(s) that is usable in a magnetic device such as a STT-RAM and, therefore, in a variety of electronic devices. For simplicity, some steps may be omitted, performed in another or combined. Further, the method 550 may start after other steps in forming a magnetic memory have been performed.

Layer(s) for the bottom pinned layer may optionally be deposited, via step 552. The bottom pinned layer may be the layer 130 in the magnetic junction 100' or the layer 160 in the magnetic junction 100". The bottom pinned layer deposited in step 5502 may include a thermally robust multilayer such as the multilayer 200, 200', 200", 300, 300', 300" and/or 300'". Thus, in some embodiments, the bottom pinned layer includes multiple repeats of a RE-TM layer and an amorphous magnetic layer. Insertion and/or interfacial layers may also be deposited. Alternatively, another high perpendicular magnetic anisotropy pinned layer might be provided. In addition to the multilayer, step 552 may include depositing a PEL. In some embodiments, and insertion layer, such as an Mg layer or a Mg/Ta/Mg trilayer is deposited between the repeats of the bilayer/an interfacial layer and the PEL.

A tunneling barrier layer may optionally be deposited, via step 554. Step 554 may include radio frequency depositing an MgO layer and/or depositing and oxidizing an Mg layer. Step 554 is performed if the magnetic junction being formed is a dual magnetic junction or a bottom pinned magnetic junction.

The free layer, such as the free layer 110, is deposited, via step 556. The free layer provided in step 5506 may include a thermally robust multilayer such as the multilayer 200, 200', 200", 300, 300', 300" and/or 300'". Thus, in some embodiments, the free layer includes multiple repeats of a RE-TM layer and an amorphous magnetic layer. Insertion and/or interfacial layers may also be present. The free layer has a high perpendicular magnetic anisotropy. Thus, the free layer deposited in step 556 may have a perpendicular-to-plane magnetic moment.

A tunneling barrier layer may optionally be provided, via step 558. Step 558 may include radio frequency depositing an MgO layer and/or depositing and oxidizing an Mg layer. Step 558 is performed if the magnetic junction being formed is a dual magnetic junction or a top pinned magnetic junction. For a dual magnetic junction, the tunneling barrier layer provided in step 558 may be the main (thicker/higher magnetoresistance) barrier layer. Thus, the spacer layers provided in steps 554 and 558 may have different resistances in order to distinguish the magnetic states of the free layer.

An anneal at temperature(s) exceeding room temperatures is performed, via step 560. The anneal temperature(s) may be at least four hundred degrees Celsius. In some embodiments, the temperature(s) of the anneal are at least four hundred fifty degrees Celsius. In some embodiments, the higher temperature anneal (at least four hundred fifty degrees Celsius) may be preferred. In other embodiments, however, the anneal may be at lower temperatures including temperatures as low as three hundred fifty degrees Celsius. In some embodiments, the anneal performed is a rapid thermal anneal (RTA). For example, the anneal may be for not more than ten minutes. In some embodiments, the anneal time does not exceed two minutes. The anneal performed in step 560 may be used to at least partially crystallize (improve the crystallization of) the tunneling barrier layer(s) of step 554 and/or 558. Thus, step 560 may be considered part of the step of forming the tunneling barrier layer(s). However, because the anneal is performed after deposition of the tunneling barrier layer(s), the anneal might also be considered to be part of formation of the top pinned layer.

A PEL is optionally deposited, via step 562. Step 562 includes depositing a CoFeB layer and/or a FeB layer. Step 562 may be considered part of forming a pinned layer.

An additional anneal at temperature(s) exceeding room temperatures may optionally be performed, via step 564. The anneal temperature(s) may be at least four hundred degrees Celsius. In some embodiments, the temperature(s) of the anneal are at least four hundred fifty degrees Celsius. However, a lower temperature (e.g. four hundred degree Celsius) anneal may be preferred. In other embodiments, however, the anneal may be at lower temperatures including temperatures as low as three hundred fifty degrees Celsius. In some embodiments, the anneal performed in step 564 is a RTA. For example, the anneal may be for not more than twenty minutes. In some embodiments, the anneal time does not exceed ten minutes. The anneal performed in step 564 may be used to at least partially crystallize (improve the crystallization of) the tunneling barrier layer(s) of step 554 and/or 558. However, because the anneal is performed after deposition of the PEL, the anneal might also be considered to be part of formation of the top pinned layer.

A remaining portion of the top pinned layer may optionally be deposited, via step 566. The top pinned layer may be the layer 130 in the magnetic junction 100 or 100". Step 510 may include a depositing thermally robust multilayer such as the multilayer 200, 200', 200", 300, 300', 300" and/or 300'''. Thus, in some embodiments, the top pinned layer includes multiple repeats of a RE-TM layer and an amorphous magnetic layer. Insertion and/or interfacial layers may also be present. Alternatively, another pinned layer might be provided. The pinned layer provided may have a high perpendicular magnetic anisotropy. Thus, step 566 may include depositing multiple layers. Although not indicated, capping and/or other layers might also be deposited.

The magnetic junction is defined, via step 568. Step 568 includes providing a mask covering the portion of the stack of layers that is desired to become the magnetic junction(s). The exposed portion of the stack is removed, for example using an ion mill. Fabrication of the magnetic junction and magnetic device may continue.

Using the method 550, the magnetic junction(s) 100, 100' and/or 100" employing one or more of the multilayers 200, 200', 200", 300, 300', 300" and/or 300''' may be formed. Thus, the benefits of the magnetic junction(s) 100, 100' and/or 100" may be achieved. Thus, performance of the magnetic junction(s) 100, 100' and/or 100" may be improved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device comprising:
   a free layer, the free layer being switchable between a plurality of stable magnetic states when a write current is passed through the magnetic junction, the free layer having a free layer perpendicular magnetic anisotropy energy greater than a free layer out-of-plane demagnetization energy;
   a nonmagnetic spacer layer; and
   a pinned layer, the nonmagnetic spacer layer residing between the pinned layer and the free layer, the pinned layer having a pinned layer perpendicular magnetic anisotropy energy greater than a pinned layer out-of-plane demagnetization energy, at least one of the pinned layer and the free layer including a multilayer, the multilayer including at least one bilayer, each of the at least one bilayer including a first layer and a second layer, the first layer including an alloy of a magnetic transition metal and a rare earth, the second layer including an amorphous magnetic layer, the multilayer having a nonzero multilayer perpendicular magnetic anisotropy up to a temperature of at least four hundred degrees Celsius.

2. The magnetic junction of claim 1 wherein the magnetic transition metal is Co and the rare earth is Tb such that the first layer includes $Co_xTb_{1-x}$ where is at least 0.4 and not more than 0.5 and wherein the amorphous magnetic layer includes at least one of CoFeB and FeB.

3. The magnetic junction of claim 2 wherein the multilayer further includes at least one interfacial layer, the at least one bilayer being adjacent to the at least one interfacial layer.

4. The magnetic junction of claim 3 wherein the multilayer further includes at least one insertion layer, at least one location of the at least one insertion layer being selected from a first location between the bilayer and the at least one interfacial layer and a second location such that the at least one interfacial layer is between the bilayer and the at least one insertion layer, the at least one insertion layer including a Tb blocking material.

5. The magnetic junction of claim 4 wherein the Tb blocking material includes at least one of Ta, W, Hf and Mg.

6. The magnetic junction of claim 1 wherein the pinned layer further includes a polarization enhancement layer adjoining the nonmagnetic spacer layer.

7. The magnetic junction of claim 1 further comprising:
   an additional nonmagnetic layer, the free layer being between the nonmagnetic layer and the additional nonmagnetic layer; and
   an additional pinned layer, the additional nonmagnetic layer being between the free layer and the additional pinned layer.

8. The magnetic junction of claim 7 wherein the additional pinned layer includes an additional multilayer including at least one additional bilayer, each of the additional bilayer including an additional first layer and an additional second layer, the additional first layer including an additional alloy of an additional magnetic transition metal and an additional rare earth, the second layer including an additional amorphous magnetic layer, the additional multilayer having an additional nonzero multilayer perpendicular magnetic anisotropy up to the temperature of at least four hundred degrees Celsius.

9. A magnetic memory residing on a substrate, the magnetic memory comprising:
   a plurality of magnetic storage cells, each of the plurality of magnetic storage cells including at least one magnetic junction, the at least one magnetic junction including a pinned layer, a free layer and a nonmagnetic spacer layer between the pinned layer and the free layer, the free layer being switchable between a plurality of stable magnetic states when a write current is passed through the magnetic junction, the free layer having a free layer perpendicular magnetic anisotropy energy greater than a free layer out-of-plane demagnetization energy, the pinned layer having a pinned layer perpendicular magnetic anisotropy energy greater than a pinned layer out-of-plane demagnetization energy, at least one of the pinned layer and the free layer including a multilayer, the multilayer including at least one bilayer, each of the at least one bilayer including a first layer and a second layer, the first layer including an alloy of a magnetic transition metal and a rare earth, the second layer including an amorphous magnetic layer, the multilayer having a nonzero multilayer perpendicular magnetic anisotropy up to a temperature of at least four hundred degrees Celsius; and
   a plurality of bit lines coupled with the plurality of magnetic storage cells.

10. The magnetic memory of claim 9 the magnetic transition metal is Co and the rare earth is Tb such that the first layer includes $Co_xTb_{1-x}$ where is at least 0.4 and not more than 0.5 and wherein the amorphous magnetic layer includes at least one of CoFeB and FeB.

11. The memory of claim 10 wherein the multilayer further includes at least one interfacial layer, the at least one bilayer being adjacent to the at least one interfacial layer.

12. The magnetic memory of claim 11 wherein the multilayer further includes at least one insertion layer, a location of the at least one insertion layer being selected from a first location between the bilayer and the at least one interfacial layer and a second location such that the at least one interfacial layer is between the bilayer and the at least one insertion layer, the at least one additional insertion layer including a Tb blocking material.

13. A method for providing magnetic junction residing on a substrate and usable in a magnetic device, the method comprising:
    providing a free layer, the free layer being switchable between a plurality of stable magnetic states when a write current is passed through the magnetic junction, the free layer having a free layer perpendicular magnetic anisotropy energy greater than a free layer out-of-plane demagnetization energy;
    providing a nonmagnetic spacer layer; and
    providing a pinned layer, the nonmagnetic spacer layer residing between the pinned layer and the free layer, the pinned layer having a pinned layer perpendicular magnetic anisotropy energy greater than a pinned layer out-of-plane demagnetization energy, at least one of the pinned layer and the free layer including a multilayer, the multilayer including at least one bilayer, each of the at least one bilayer including a first layer and a second layer, the first layer including an alloy of a magnetic transition metal and a rare earth, the second layer including an amorphous magnetic layer, the multilayer having a nonzero multilayer perpendicular magnetic anisotropy up to a temperature of at least four hundred degrees Celsius.

14. The method of claim 13 wherein the free layer resides between the pinned layer and a substrate, wherein the pinned layer includes a polarization enhancement layer (PEL) and wherein the step of providing the pinned layer further includes;
    annealing at least the free layer and the nonmagnetic spacer layer before deposition of the PEL at at least a first anneal temperature of at least four hundred degrees Celsius;
    depositing the PEL; and
    annealing the at least the free layer, the nonmagnetic spacer layer and the PEL before deposition of the multilayer at at least a second anneal temperature of at least four hundred degrees Celsius.

15. The method of claim 14 wherein the pinned layer resides between the free and a substrate, the method further comprising:
    performing at least one anneal of at least the free layer, the nonmagnetic spacer layer and the pinned layer at at least at least one anneal temperature, the at least one anneal temperature being at least four hundred degrees Celsius.

16. The method of claim 14 wherein the magnetic transition metal is Co and the rare earth is Tb such that the first layer includes $Co_xTb_{1-x}$ where is at least 0.4 and not more than 0.5 and wherein the amorphous magnetic layer includes at least one of CoFeB and FeB.

17. The method of claim 14 wherein the multilayer further includes at least one interfacial layer, the at least one bilayer being adjacent to the at least one interfacial layer.

18. The method of claim 14 wherein the multilayer further includes at least one insertion layer, a location of the at least one insertion layer being selected from a first location between the bilayer and the at least one interfacial layer and a second location such that the at least one interfacial layer is between the bilayer and the at least one insertion layer, the at least one insertion layer including a Tb blocking material.

* * * * *